United States Patent
Iwasaki et al.

(10) Patent No.: US 7,637,743 B2
(45) Date of Patent: Dec. 29, 2009

(54) ELECTRONIC DEVICE WITH A STRUCTURE PREVENTING A ELECTROMAGNETIC WAVE LEAK

(75) Inventors: Fuminobu Iwasaki, Kawasaki (JP); Motohiro Takemae, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/826,983

(22) Filed: Jul. 19, 2007

(65) Prior Publication Data

US 2007/0264860 A1 Nov. 15, 2007

Related U.S. Application Data

(63) Continuation of application No. PCT/JP2005/001125, filed on Jan. 27, 2005.

(51) Int. Cl.
*H01R 39/00* (2006.01)
(52) U.S. Cl. ............... 439/17; 439/64; 439/377; 439/92; 439/95
(58) Field of Classification Search .......... 439/17, 439/64, 377, 92, 95, 607, 607.01
See application file for complete search history.

(56) References Cited

U.S. PATENT DOCUMENTS 5,321,583 A * 6/1994 McMahon .............. 361/770
5,470,260 A * 11/1995 Schwan et al. ........... 439/630
6,196,850 B1 * 3/2001 Dietz et al. .............. 439/17
6,655,977 B2 * 12/2003 Ives et al. ................ 439/342
6,857,908 B2 * 2/2005 Burmeister .............. 439/632
2005/0106900 A1 * 5/2005 Poth ..................... 439/17

FOREIGN PATENT DOCUMENTS

| JP | 64-387 | 1/1989 |
|---|---|---|
| JP | 1-161385 | 11/1989 |
| JP | 5-243773 | 9/1993 |
| JP | 5-83863 | 11/1993 |
| JP | 5-343869 | 12/1993 |
| JP | 7-32992 | 6/1995 |
| JP | 8-288674 | 11/1996 |
| JP | 9-191186 | 7/1997 |
| JP | 2001-168572 | 6/2001 |
| JP | 2002-339666 | 11/2002 |

OTHER PUBLICATIONS

International Search Report of International Published Application No. PCT/JP2005/001125 (mailed Apr. 26, 2005).
PCT Published Application No. WO 2006/080070, Published Aug. 3, 2006, (International Application No. PCT/JP2005/001125).

* cited by examiner

*Primary Examiner*—Tho D Ta
(74) *Attorney, Agent, or Firm*—Staas & Halsey LLP

(57) ABSTRACT

A conductive roller is arranged so as to project from an opening of an upper surface of a circuit board unit removably accommodated in a rack. An opening of the rack is covered by a conductive thin plate. When the circuit board unit is accommodated in the rack, the roller fits in the opening of the rack and pushes the conductive thin plate. Thus, the circuit board unit and the rack are brought into electrical contact to perform electromagnetic shielding.

16 Claims, 8 Drawing Sheets

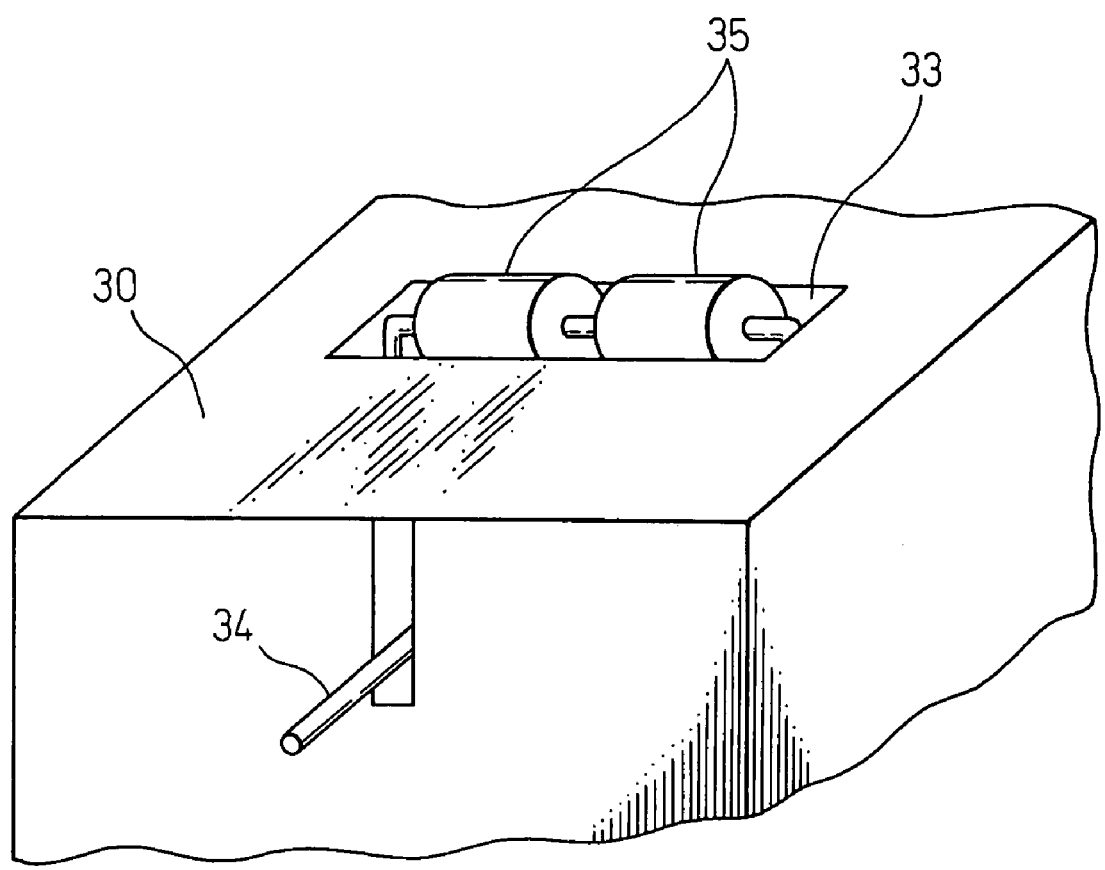

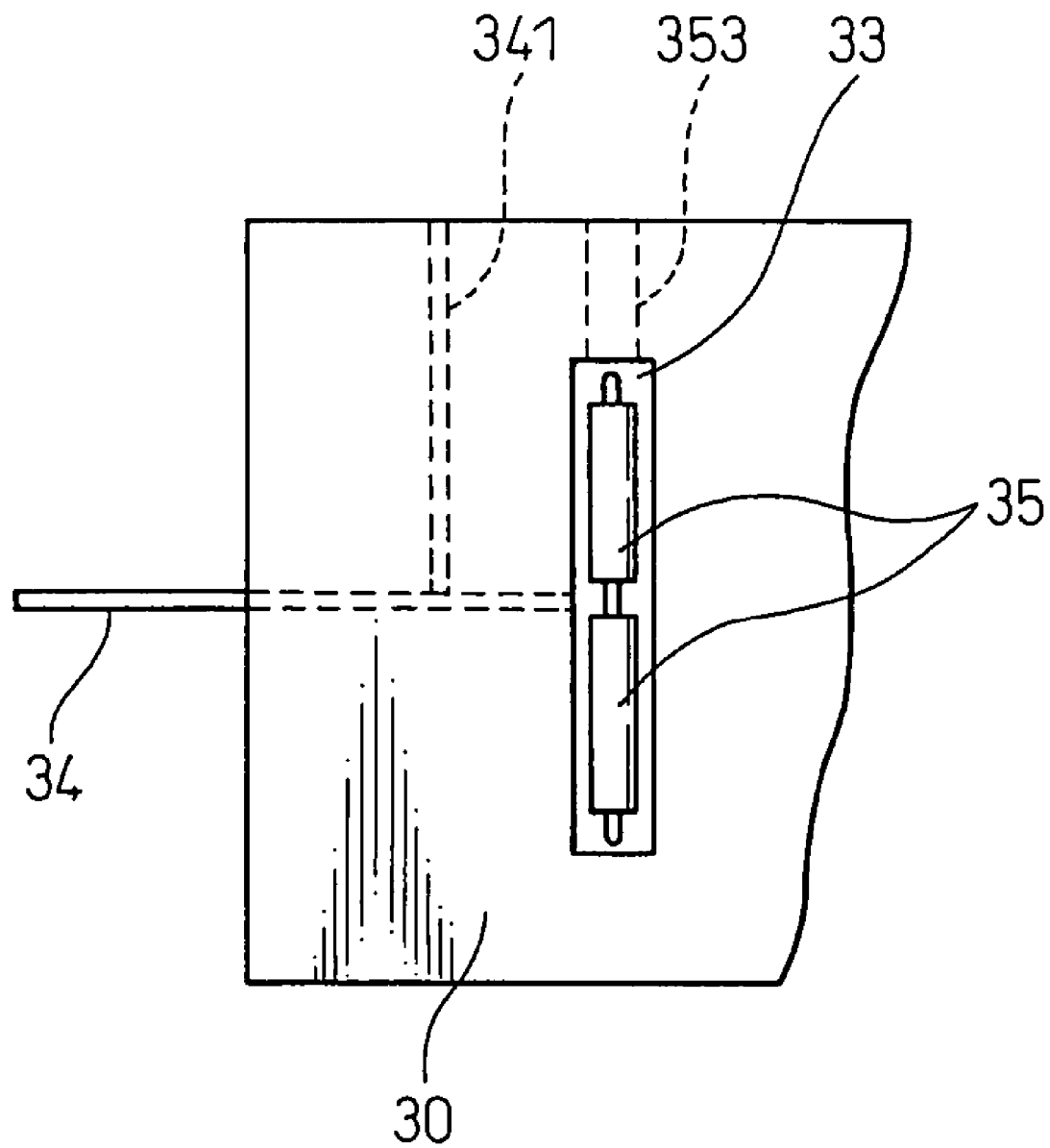

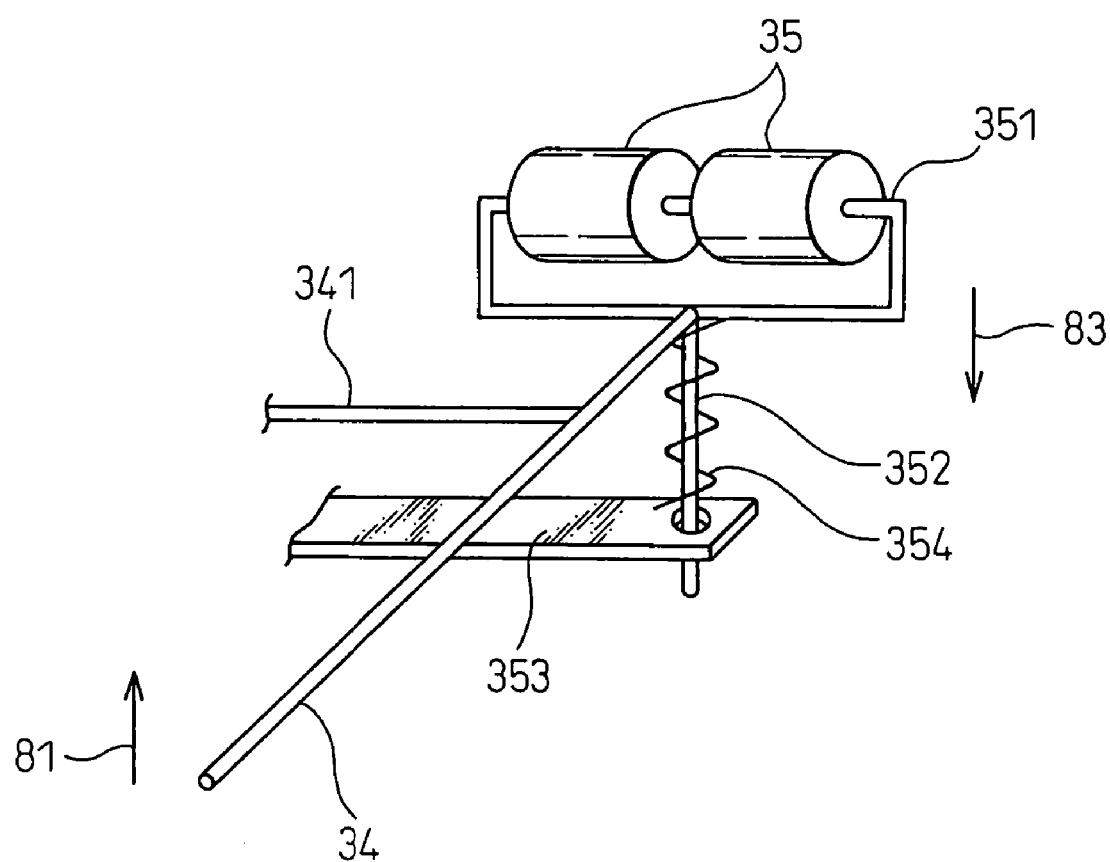

ELECTRONIC DEVICE WITH A STRUCTURE PREVENTING A ELECTROMAGNETIC WAVE LEAK

CROSS-REFERENCE TO RELATED APPLICATIONS

This is a continuation of International Application PCT/JP05/01125, published in Japanese, with an international filing date of Jan. 27, 2005.

TECHNICAL FIELD

The present invention relates to an electronic device including a circuit board unit and a rack for accommodating the circuit board unit, and more particularly, to an electronic device including an electromagnetic wave leakage preventing unit that prevents leakage of an electromagnetic wave from the circuit board unit.

BACKGROUND ART

A disk array device accommodating a hard disk accommodates a removable circuit board unit mounted with the hard disk and circuit components such as a controller. The apparatus that accommodates the circuit board unit in a casing or a rack needs to prevent leakage of electronmagnetic waves from the front surface of the rack accommodating the circuit board unit. Therefore, the circuit board unit accommodated in the rack is electrically connected to the rack and is grounded. In recent years, the number of clock circuits on a circuit board has increased, and the need for strengthening the shielding against electromagnetic waves is increasing.

For this purpose, it is proposed that a metal sheet spring is provided on the upper surface of the circuit board unit, wherein the circuit board unit is pressed against the rack and is electrically connected to the rack (see Japanese Patent Application Unexamined Publication No. 5-243773). However, the sheet spring has a small contact area with the rack, and cannot obtain sufficient electric contact with the rack to shield the circuit board unit. Further, the sheet spring is plastically deformed during long use, resulting in the occurrence of contact failure.

Further, a conventional apparatus has a mechanism of locking the rack after accommodating the circuit board unit in the rack, on the front surface of the unit. This mechanism is necessary to securely connect the circuit board unit with a backboard within the rack. However, recently as the number of circuit connecting ports has increased, it has become necessary to secure a connector-fitting space on the surface of the circuit board unit. Because of the presence of the locking mechanism on the front surface of the circuit board unit, it has been difficult to sufficiently secure the connector-fitting space.

DISCLOSURE OF THE INVENTION

In light of the above conventional problems, it is an object of the present invention to provide an electronic device capable of securely shielding against electromagnetic waves from a circuit board unit. It is another object of the invention to provide an electronic device that does not require a specific locking mechanism to lock a rack.

In order to solve the above problems, according to one aspect of the present invention, there is provided an electronic device including: a circuit board unit having a conductive rotation member on at least one surface of the circuit board; and a rack for accommodating the circuit board unit, the rack having an opening that is covered by a flexible conductive member and is fit by the conductive rotation member.

The electronic device can include a pushing member to push the conductive rotation member, and the conductive rotation member can be pushed against the conductive flexible unit in a state where the circuit board unit is accommodated in the rack.

Further, the electronic device can include a canceling member that cancels the fit of the conductive rotation member.

According to other aspect of the invention, there is provided an electronic device including a first enclosure having a conductive rotation member on at least one surface of the first enclosure, and a second enclosure for accommodating the first enclosure, the second enclosure having a flexible conductive member at a position where the conductive rotation member is into contact with the flexible conductive member in a state of the first enclosure is accommodated in the second enclosure.

The electronic device according to the present invention electrically connects a circuit board securely with a rack, thereby strengthening the electromagnetic shielding of the circuit board unit, and does not require a specific locking mechanism.

BRIEF DESCRIPTION OF THE DRAWINGS

FIG. 3a is a perspective view showing a roller supported by the rotation board unit.

FIG. 3b is a partial view of the upper surface of the circuit board unit.

FIG. 4 is a perspective view showing a roller supported by the rotation board unit.

BEST MODE FOR CARRYING OUT THE INVENTION

Before explaining the embodiment of the present invention, an electronic device to which the present invention is not applied is explained in order to clarify the operation and effect of the present invention.

Figure 8:
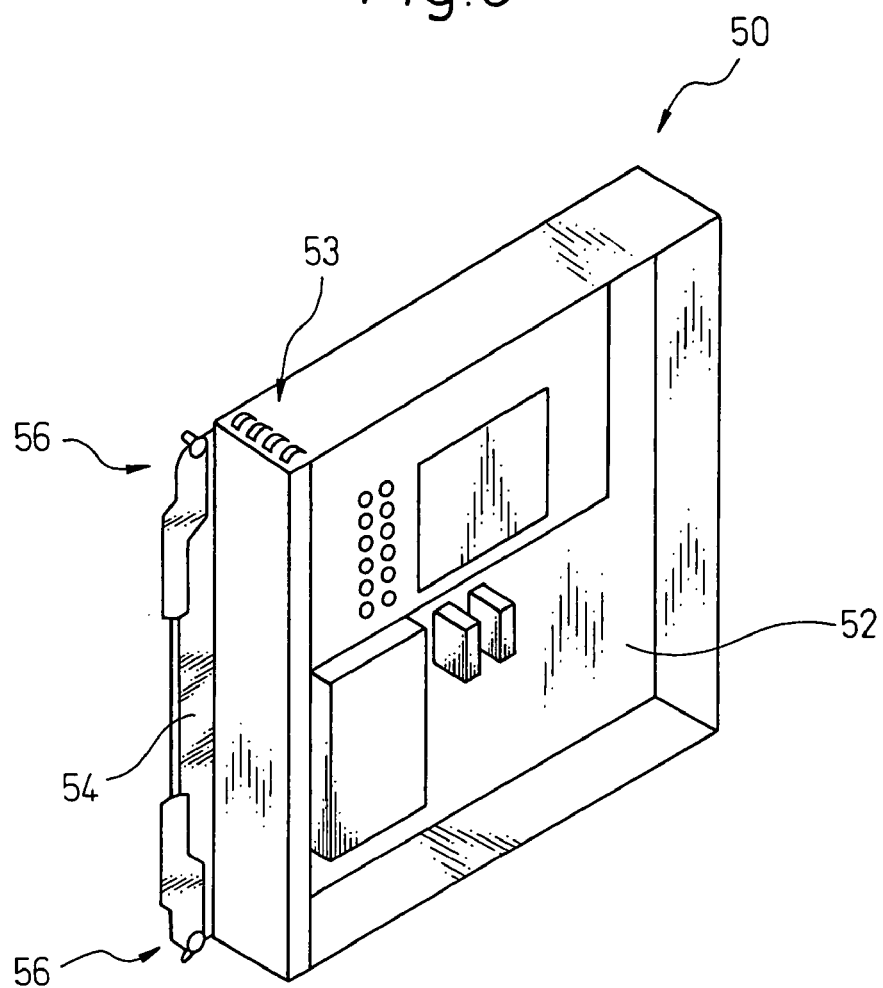
FIG. 8 is a view showing one example of a conventional circuit board unit.
Figure 9:
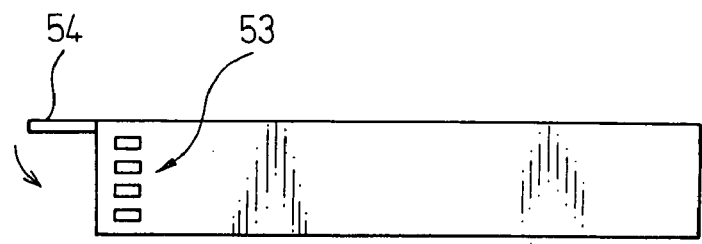
FIG. 9 is a top plan view of one example of a conventional circuit board unit.

FIGS. 8 and 9 show outlines of a conventional circuit board unit. FIG. 8 is a perspective view and FIG. 9 is a top plan view. A circuit board unit 50 is inserted into a rack (not shown) to be used. The circuit board unit 50 accommodates a printed circuit board 52 mounted with various electronic circuit components. A front plate 54 having a locking mechanism 56 is provided on the front surface of the unit 50. After the board unit 50 is accommodated in the rack, this front plate 54 is closed, and the board unit 50 is locked in the rack. A detailed explanation of the locking mechanism 56 is omitted. The board unit 50 has shielding springs 53 including plural metal sheet springs on the upper surface. When the board unit 50 is accommodated in the rack, the shielding springs 53 are brought into contact with the rack. Leakage of electromagnetic waves from the front surface of the board unit 50 are prevented, by bringing the board unit 50 into electric contact with the rack.

However, the shielding springs 53 have a small contact area with the rack, and are not sufficient to shield the electromagnetic waves emitted from the circuit board unit. The sheet spring generates plastic deformation during long usage, and can easily generate a contact failure. The shielding springs 53 are embedded into the rack one by one, and therefore, it takes time to manufacture the circuit board unit. Further, there is a risk of losing each shielding spring. In locking the circuit board unit 50, the front plate 54 is turned to a direction of the arrow shown in FIG. 9, thereby closing the front plate 54. Therefore, the front plate 54 substantially blocks the front surface of the circuit board unit 50. Consequently, sufficient space for a connector cannot be provided on the front surface of the circuit board unit 50.

Figure 1:
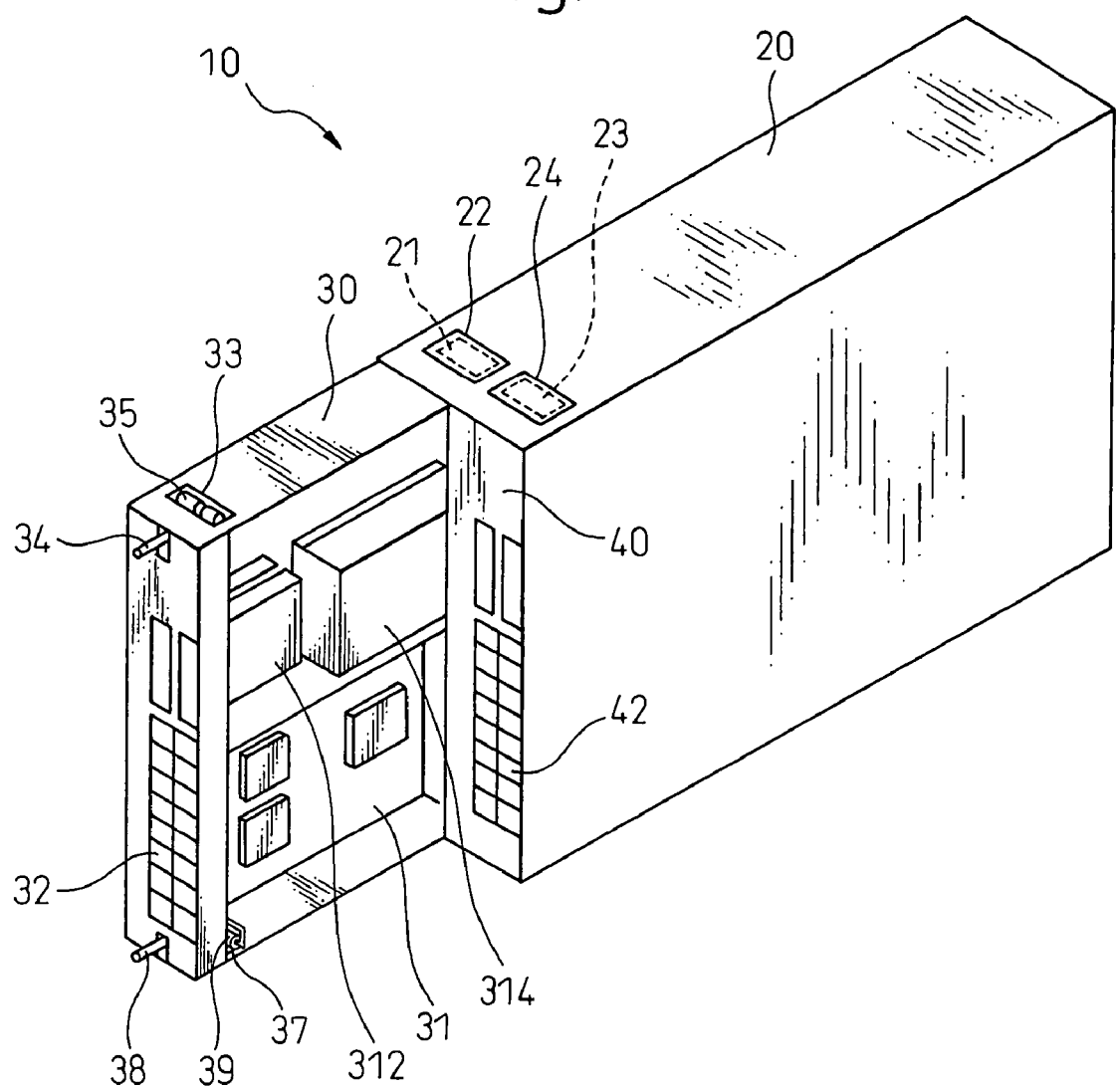
FIG. 1 is a schematic view of an electronic device including a circuit board unit and a rack according to a first embodiment of the present invention.

The present invention solves the above problems. An embodiment of the present invention is explained below with reference to the drawings. FIG. 1 is a schematic view of an electronic device 10 according to an embodiment of the present invention. The electronic device 10 includes a rack 20 and circuit board units 30 and 40. The circuit board units 30 and 40 can be inserted into and extracted from the rack 20. In FIG. 1, the circuit board unit 30 is extracted. The circuit board unit 30 accommodates a printed circuit board 31 mounted with various electronic circuit components such as a hard disk device 312, a CPU 314, and a controller. An opening is formed on the front surface of the circuit board unit 30, and a hard disk device can be exchanged through this opening. A connector 32 of the printed circuit board 31 can be electrically connected to an external device via a connector space provided on the front surface of the printed circuit board 31.

Figure 2A:
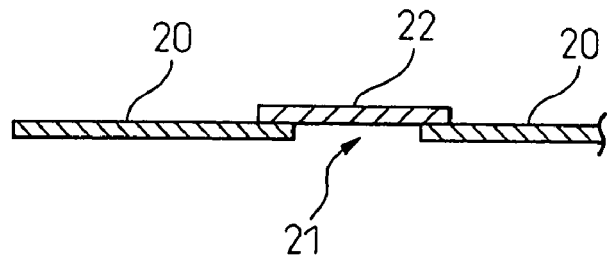
FIG. 2a is a view showing an opening of the circuit board unit and a conductive thin plate provided on the upper surface of the opening.
Figure 2B:
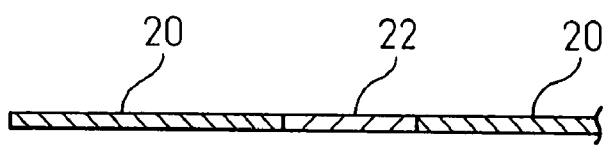
FIG. 2b is a view showing an opening of the circuit board unit and a conductive thin plate provided at end surfaces of the opening.
Figure 2C:
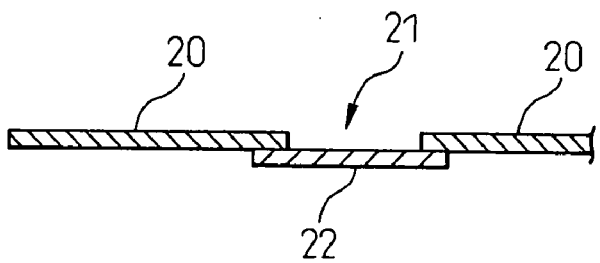
FIG. 2c is a view showing an opening of the circuit board unit and a conductive thin plate provided on the lower surface of the opening.

An opening 33 is provided on the upper surface of the circuit board unit 30 near the front surface, and a roller 35 is provided to project from the opening 33. An opening 37 is similarly provided on the lower surface of the circuit board unit 30, and a roller 39 is provided to project from the opening 37. The rollers 35 and 39 are made of a conductive substance, such as metal and rubber. On the other hand, an opening 21 is provided on the upper surface of the rack 20 that accommodates the circuit board unit 30. The roller 35 of the circuit board unit 30 is fit into the opening 21 when the circuit board unit 30 is completely accommodated in the rack 20. Further, a flexible conductive thin plate 22 such as a thin gasket, conductive rubber or metal is provided on the opening 21. The thin plate 22 is disposed on the upper surface of the opening 21, as shown in FIG. 2a. Alternatively, the thin plate 22 can be disposed in contact with a side surface of the opening, as shown in FIG. 2b, or can be disposed on a lower part of the opening, as shown in FIG. 2c. Alternatively, a flexible conductive thin plate can be disposed on an inner surface of the rack, without forming an opening on the rack. In this case, a thin plate can be simply adhered to the inner surface of the rack, or the thin plate can be disposed in a recess formed on the inner surface of the rack.

Although not shown in the drawings, an opening is also provided on the lower surface of the rack 20. The roller 39 of the circuit board unit 30 is fit into the opening when the circuit board unit 30 is accommodated in the rack 20. This opening is also covered with a conductive metal thin plate like the conductive thin plate 22. The lower surface of the circuit board unit 30 is usually brought into close contact with the inner surface of the rack 20, based on the weight of the circuit board unit 30. Therefore, the opening 37 and the roller 39 on the lower surface of the unit can be omitted. As explained below, the fitting of the rollers 35 and 39 with the opening of the rack 20 can be canceled by operating cancellation bars 34 and 38.

FIGS. 3a and 3b are explanatory views of a supporting mechanism of the roller 35. FIG. 3a is a perspective view of the upper surface of the circuit board unit 30, and FIG. 3b is a partial view of the upper surface of the circuit board unit 30. As shown in FIG. 3a, the roller 35 is configured to project from the opening 33. When the circuit board unit 30 is accommodated in the rack, the roller 35 is brought into contact with the thin plate 22 provided on the opening 21 of the rack 20 to electrically connect the circuit board unit 30 with the rack 20. Therefore, the roller 35 and the supporting mechanism to support the roller 35 in the circuit board unit 30 are made with a conductive material. While two rollers are provided in the present example, one or more rollers can be provided. In all cases, the roller 35 has conductivity. While the roller 35 is formed in a cylindrical shape, the roller can be in a barrel shape or a spherical shape. A person skilled in the art can select an optimum shape, size, and an optimum number of rollers 35 to achieve the present invention. The roller 35 for electrically connecting the circuit board unit 30 with the rack 20 is rotatably supported by a roller axis 351. The rack axis 351 includes a supporting bar 352 as shown in FIG. 4. The supporting bar 352 is supported by a supporting plate 353 fixed to the circuit board unit, via a spring 354, and is passed through a hole of the supporting plate 353. The spring 354 usually works to press the roller 35 upwards as shown in the drawings. The cancellation bar 34 is connected to the supporting bar 352. The other end of the cancellation bar 34 is extended to the outside of the unit 30, and can be operated, as shown in FIGS. 3a and 3b. The cancellation bar 34 has a supporting axis 341 fixed to the circuit board unit 30. The supporting axis 341 supports the cancellation bar 34, and also gives the cancellation bar 34 a supporting point. When the cancellation bar 34 is pressed upwards in the direction shown by the arrow 81 from the outside of the circuit board unit 30 as shown in FIG. 4, the supporting bar 351 connected to the other end of the cancellation bar moves downwards in the direction shown by the arrow 83, against the spring 352. Therefore, the roller 35 connected to the supporting bar 352 also moves downwards.

Figure 5:
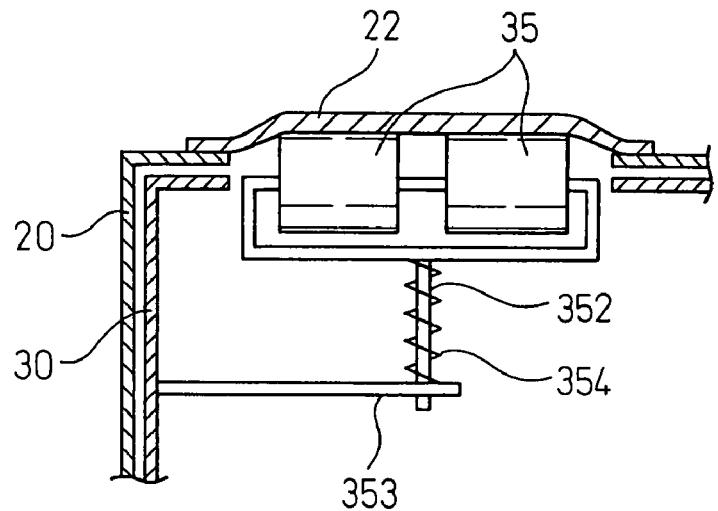
FIG. 5 is an explanatory view of a supporting mechanism of the roller of the circuit board unit.
Figure 6:
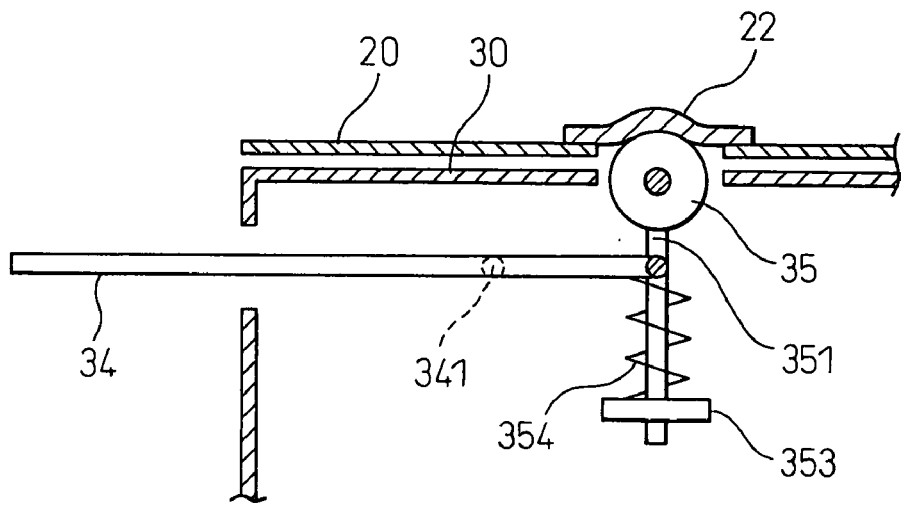
FIG. 6 is a view showing a state that the roller of the circuit board unit is in contact with the conductive thin plate of the rack, as observed from a direction different from that of FIG. 4.

FIGS. 5 and 6 show a state in which the circuit board unit 30 is accommodated in the rack 20, and the roller 35 is fitted into the opening of the rack. When the circuit board unit 30 is accommodated in the rack 20, the conductive roller 35 is pressed against the conductive thin plate 22 by the spring 354. The thin plate 22 is bent by being pressed by the conductive roller 35, and is deformed to cover the roller. Therefore, the curved surface of the roller 35 is brought into close contact with the thin plate 22, thereby increasing contact area obtained by the electric connection using a sheet spring. Consequently, highly reliable electromagnetic shielding can be achieved. The roller 35 is projected from the opening of the rack 20, and the circuit board unit 30 is locked in the rack 20 based on frictional force applied between the thin plate 22 and the roller 35. Effective locking is achieved in this way, without using a specific locking mechanism as required in the conventional practice. In the locked state, the cancellation bar 34 is held horizontally, as shown in FIG. 6.

Figure 7:
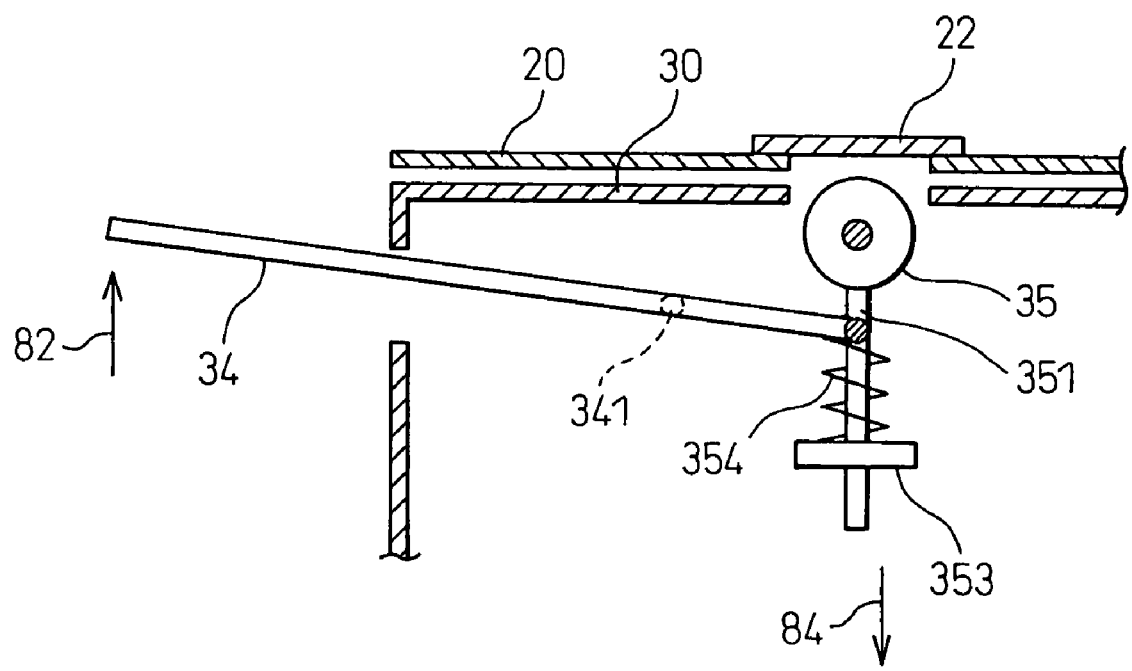
FIG. 7 is a view showing a state that the roller of the circuit board unit is separated from the conductive thin plate of the rack.

FIG. 7 shows a state right before the circuit board unit 30 is extracted from the rack 20. When the circuit board unit 30 is extracted from the rack 20, the cancellation bar 34 stretched from the circuit board unit 30 is lifted by an operator up in the direction shown by the arrow 82, as shown in FIG. 7. The other end of the cancellation bar 34 moves downwards in the direction shown by the arrow 84, with the supporting axis 341 used as a supporting point, thereby lowering the roller 35. As a result, the spring 34 is compressed, and the roller 35 leaves the thin plate 22, and is extracted from the opening of the rack 20. When the circuit board unit 30 is extracted from the rack 20 in a state that locking is cancelled, the roller 35 guides the circuit board unit 30 along the upper surface of the rack 20, and the circuit board unit 30 can be extracted. While only the roller 35 on the upper surface is explained, a similar operation is also applied to the roller 39 on the lower surface.

The roller supporting mechanism explained above shows only one example. When the roller can electrically contact the thin plate, any supporting mechanism or any supporting unit can be used. A unit that separates the contacted roller from the thin plate can be suitably used.

As explained above, according to the embodiment of the present invention, an electronic device configured to accommodate a circuit board unit in a rack can simultaneously achieve both electric contact and mechanical locking, by bringing a conductive rotation body of the circuit board unit into contact with a conductive flexible unit of the rack, in a state that the circuit board unit is accommodated in the rack. Because a specific mechanism for locking is not required on the front surface of the circuit board, the front surface of the circuit board unit can be used as space for a connector. Therefore, the electronic device can be used with fewer restrictions.

The invention claimed is:

1. An electronic device comprising:
   a circuit board unit having a conductive rotation member on at least one surface of the circuit board unit, the conductive rotation member being rotatably supported by a roller axis; and
   a rack for accommodating the circuit board unit, the rack having an opening that is covered by a flexible conductive member and is fit by the conductive rotation member.

2. The electronic device according to claim 1, further comprising a pushing member to push the conductive rotation member, wherein the pushing member pushes the conductive rotation member against the flexible conductive member in a state that the circuit board unit is accommodated in the rack.

3. The electronic device according to claim 1, comprising a canceling member that cancels the engagement of the conductive rotation member.

4. The electronic device according to claim 1, wherein the conductive rotation member is arranged on the upper surface of the circuit board unit.

5. The electronic device according to claim 4, wherein the conductive rotation member is further arranged on the lower surface of the circuit board unit.

6. The electronic device according to claim 1, wherein the conductive rotation member has a cylindrical shape.

7. An electronic device comprising:
   a first enclosure having a conductive rotation member on at least one surface of the first enclosure, the conductive rotation member being rotatably supported by a roller axis; and
   a second enclosure for accommodating the first enclosure, the second enclosure having a flexible conductive member at a position where the conductive rotation member is brought into contact with the flexible conductive member in a state that the first enclosure is accommodated in the second enclosure.

8. An electronic device comprising a circuit board unit having a conductive rotation member, rotatably supported by a roller axis, provided at one or more surfaces of the circuit board unit to electrically contact a rack that receives the circuit board unit.

9. An electronic device comprising:
   a circuit board unit having a conductive rotation member on at least one surface of the circuit board unit, the conductive rotation member having a cylindrical shape and being rotatably supported by a roller axis extending along the central axis of the conductive rotation member; and
   a rack for accommodating the circuit board unit, the rack having an opening that is covered by a flexible conductive member and is fit by the conductive rotation member.

10. The electronic device according to claim 9, further comprising a pushing member to push the conductive rotation member, wherein the pushing member pushes the conductive rotation member against the flexible conductive member in a state that the circuit board unit is accommodated in the rack.

11. The electronic device according to claim 9, comprising a canceling member that cancels the engagement of the conductive rotation member.

12. The electronic device according to claim 10, wherein the pushing member provides to the roller axis a biasing force along the vertical direction so as to move the conductive rotation member outside of the circuit board unit.

13. The electronic device according to claim 10, wherein the pushing member is placed between the conductive rotation member and a plate for supporting the pushing member.

14. The electronic device according to claim 11, wherein an intermediate part of the canceling member is connected to a supporting axis fixed to the circuit board unit, and an end of the canceling member is connected to the roller axis and rotated around the supporting axis.

15. The electronic device according to claim 9, wherein the opening is larger than the outer shape of the conductive rotation member.

16. The electronic device according to claim 11, wherein, when the canceling member cancels the engagement of the conductive rotation member, the conductive rotation member is stored in the circuit board unit.

* * * * *